United States Patent [19]
Imai et al.

[11] Patent Number: 6,124,077
[45] Date of Patent: Sep. 26, 2000

[54] VISIBLE LIGHT-SENSITIVE COMPOSITIONS AND PATTERN FORMATION PROCESS

[75] Inventors: Genji Imai, Hiratsuka; Hideo Kogure, Atsugi, both of Japan

[73] Assignee: Kansai Paint Co., Ltd., Hyogo-Ken, Japan

[21] Appl. No.: 09/145,974

[22] Filed: Sep. 3, 1998

[30] Foreign Application Priority Data

Sep. 5, 1997 [JP] Japan ................................. 9-256236
Sep. 8, 1997 [JP] Japan ................................. 9-257974

[51] Int. Cl.⁷ ...................................................... G03F 7/004
[52] U.S. Cl. ................................... 430/281.1; 430/270.1; 430/325; 430/926
[58] Field of Search .......................... 430/281.1, 325, 430/270.1, 926

[56] References Cited

U.S. PATENT DOCUMENTS

| | | | |
|---|---|---|---|
| 4,877,719 | 10/1989 | Higashi et al. ......................... | 430/326 |
| 5,364,738 | 11/1994 | Kondo et al. ........................... | 430/283 |
| 5,496,678 | 3/1996 | Imai et al. ............................... | 430/176 |
| 5,679,495 | 10/1997 | Yamachika et al. .................... | 430/191 |
| 5,738,974 | 4/1998 | Nagasaka et al. ...................... | 430/278.1 |

FOREIGN PATENT DOCUMENTS 6-295064  10/1994  Japan .
7-146552  6/1995  Japan .

*Primary Examiner*—Janet Baxter
*Assistant Examiner*—Rosemary Ashton
*Attorney, Agent, or Firm*—Wenderoth, Lind & Ponack, LLP.

[57] ABSTRACT

An excellently thermostable visible light-sensitive composition comprising (A) a polymer having carboxyl group(s) or a polymer having carboxyl group(s) and hydroxyphenyl group(s), or (A') a polymer having carboxyl group(s) and (A") a polymer having hydroxyphenyl group(s); (B) a compound having at least two vinyl ether groups per molecule, (C) a compound, which generates an acid when irradiated with a visible light; and (D) a sensitizing dye, and a process for pattern formation using such a composition are disclosed.

25 Claims, No Drawings

VISIBLE LIGHT-SENSITIVE COMPOSITIONS AND PATTERN FORMATION PROCESS

BACKGROUND OF THE INVENTION

1. Field of the Invention

The present invention relates to visible light-sensitive compositions, as well as to formation processes, using the compositions, for patterns useful to circuit formation of electronic devices, materials for printing etc.

2. Description of the Prior Art

Currently, positive type photoresists are widely used for formation of circuit patterns of electronic devices etc. As positive type resist compositions used for these applications, in many cases, combinations of an alkali-soluble novolac resins and a quinone diazide compound as a photosensitizer, are used.

These compositions utilize a reaction in which the quinone diazide group is photo-decomposed when irradiated with an ultraviolet light and forms an indenecarboxylic acid via a ketone.

The resists using this quinone diazide compound, however, are weakly photoreactive to a visible light and, hence, there are problems of insufficient resolution, etc., in the case a formation of a very fine pattern is necessary.

The present inventors previously proposed, as positive type photosensitive compositions replacing these other prior compositions, a composition sensitive also to a visible light comprising a polymer having carboxyl group(s), a compound having a plurarity of vinyl ether groups, and a compound which is decomposed and generates an acid when irradiated with an actinic ray (Japanese Laid-open Publication No. 295064/1994) and a visible light-sensitive composition comprising a polymer having carboxyl group(s) and hydroxyphenyl group(s), a compound having a plurarity of vinyl ether groups, and a compound which is decomposed and generates an acid when irradiated with an actinic ray (Japanese Laid-open Publication No. 146552/1995=U.S. Pat. No. 5,496,678).

These compositions are photosensitive compositions which function according to a mechanism wherein the film formed from them becomes insoluble in solvents and aqueous alkaline solutions through crosslinking by an addition reaction between carboxyl group(s) and vinyl either group(s) when heated. When the composition is further irradiated with an actinic ray and then heated, the exposed portions become soluble in solvents and aqueous alkaline solutions again as the crosslinked structure is severed by the catalytic action of the acid generated by the irradiation.

These compositions have advantages such as having high transparency to actinic rays, because they need not contain a large amount of a functional group of high extinction coefficient unlike resists using quinone diazide as a photosensitizer and having high sensitivity as positive type photosensitive composition because the acid generated at the exposed portions acts as catalyst, when heated, to sever the crosslinked structure in the form of a chain reaction.

However, the heating time is required to be shortened in respect of productivity, when these photosensitive compositions are coated on a substrate and heated for crosslinking. When a shortening of the time is tried by heating at a higher temperature than 100° C., there is the problem that the compound, which generates an acid when irradiated with an actinic ray, existing in said photosensitive composition, generates an acid before being irradiated by a visible light and, thus, the whole formed film is dissolved when developed. Therefore, an improvement of the thermal stability of said photosensitive composition is strongly demanded in this technical field.

The present inventors made an intensive study to solve problems the above-mentioned photosensitive compositions have. As a result, they have found that the above-mentioned problems can be solved by using naphthalimidylsulphonate, as the compound which is decomposed and generates an acid when irradiated with a visible light, in combination with a sensitizing dye and completed the present invention.

SUMMARY OF THE INVENTION

According to an aspect of the present invention, there is provided a visible light-sensitive composition characterized by comprising (A) a polymer having carboxyl group(s) and optionally having hydroxyphenyl group(s); (B) a compound having at least two vinyl ether groups per molecule, (C) a compound, which generates an acid when irradiated with a visible light, represented by the general formula

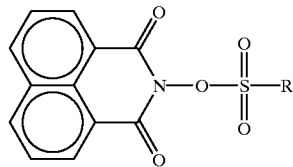

wherein R represents

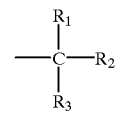

group (where $R_1$, $R_2$ and $R_3$ each independently represents hydrogen atom or fluorine atom),

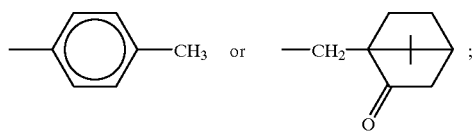

and (D) a sensitizing dye;
as well as a process for pattern formation using such a composition.

Furthermore, according to another aspect of the present invention, there is provided a visible light-sensitive composition characterized by comprising (A') a polymer having carboxyl group(s); (A") a polymer having hydroxyphenyl group(s); (B) a compound having at least more than 2 vinyl ether groups per molecule, (C) a compound, which generates an acid when irradiated with a visible light, illustrated by the above-mentioned general formula (I); and (D) a sensitizing dye; as well as a process for pattern formation using such a composition.

The compositions of the present invention are highly sensitive to a visible light, especially to Ar laser having a stable emission of radiation in a visible region of wave length 488 nm or 514.5 nm, have no problem of film dissolution during development in the pattern formation procedure due to a high thermal stability, have an excellent contrast of the formed pattern, and are useful for such applications as positive type photoresist, printing materials etc.

DETAILED DESCRIPTION OF THE INVENTION

The present invention is hereinafter described in more detail.

(A) Polymer Having Carboxyl Group(s) and Optionally Having Hydroxyphenyl Group(s)

The polymer (A) used in the visible light-sensitive composition according to the first aspect of the present invention is a film-forming polymer having at least one carboxyl group and optionally having hydroxyphenyl group(s) per molecule. The polymers having only carboxyl group(s) include, for example, homopolymers of a carboxyl group-containing polymerizable unsaturated monomer; copolymers of said carboxyl group-containing monomer and another monomer copolymerizable therewith; a resin of polyester type, polyurethane type, polyamide type or other type having carboxyl group(s) in the molecular chain or at the molecular end(s). The polymers having both carboxyl group(s) and hydroxyphenyl group(s) include, for example, copolymers of a hydroxystyrene such as p-hydroxystyrene and a carboxyl group-containing polymerizable unsaturated monomer; copolymers of a hydroxystyrene and said carboxyl group-containing monomer, and another copolymerizable monomer and the like.

The above-mentioned carboxyl group-containing polymerizable unsaturated monomers include, for example, acrylic acid, methacrylic acid, crotonic acid and itaconic acid etc. The above-mentioned other copolymerizable monomers include, for example, $C_1$–$C_{12}$ alkyl esters of (meth)acrylic acid, such as methyl (meth)acrylate, ethyl (meth)acrylate, propyl (meth)acrylate, butyl (meth)acrylate, hexyl (meth)acrylate, octyl (meth)acrylate, 2-ethylhexyl (meth)acrylate, nonyl (meth)acrylate, decyl (meth)acrylate and the like; $C_2$–$C_6$ hydroxyalkyl esters of (meth)acrylic acid, such as hydroxyethyl (meth)acrylate, 2-hydroxypropyl (meth)acrylate, 3-hydroxypropyl (meth)acrylate, hydroxybutyl (meth)acrylate and the like; aromatic vinyl compounds such as styrene, α-methylstyrene, p-tert-butylstyrene and the like; vinyl acetate, (meth)acrylonitrile, (meth)acrylamide and vinylpyrrolidone etc. These monomers can be used individually or in combination of two or more.

In particular, it is preferred to use as said other monomer aromatic vinyl compounds such as styrene, α-methylstyrene, $C_1$–$C_6$ alkyl-substituted styrene (for example, p-tert-butylstyrene) in view of the precision of formed image patterns, etching resistance and the like.

Moreover, as polymers (A) having both carboxyl group(s) and hydroxyphenyl group(s) polymers obtained by condensation of formaldehyde with a phenol carboxylic acid such as hydroxybenzoic acid, gallic acid, resorcylic acid etc., or mixture of them with one or more than two phenols selected from phenol, $C_1$–$C_{18}$ mono- or dialkylphenol or naphthol, resorcinol, catechol, etc. may be used.

The polymer (A) preferably has a number-average molecular weight in a range of generally about 500 to about 100,000, particularly about 1,000 to about 50,000 and more particularly about 1,500 to 30,000. The desirable carboxyl group content is in a range of generally 0.5 to 10 equivalents, particularly 0.5 to 8 equivalents, and more particularly 0.5 to 5 equivalents per kg of the polymer and the desirable hydroxyphenyl group content is in a range of generally 1 to 10 equivalents, particularly 2 to 8 equivalents, and more particularly 3 to 6 equivalents per kg of the polymer. When the carboxyl group content is less than 0.5 equivalents/kg, the film formed by heating before irradiation with a visible light has no sufficient crosslinking degree, and the developability tends to decrease due to low solubility of the exposed portions in alkaline developer. On the other hand, when the carboxyl group content is more than 10 equivalents/kg, the storing stability of the composition tends to decrease. When the hydroxyphenyl group content is less than 1 equivalent/kg, the crosslinking degree at the crosslinking may not be sufficient and when the hydroxyphenyl group content is more than 10 equivalents/kg, there may be a possibility of a necessity to heat at a higher temperature before irradiation with a visible light.

Further, the polymer (A) preferably has a glass transition temperature (Tg) of not lower than 0° C., particularly in a range of 5 to 70° C. When Tg is lower than 0° C., the resulting coating film is sticky and easily picks up dirt and dust, there being the possibility that the handling becomes difficult.

(A') Polymer having carboxyl group(s)

The polymer (A') used in the visible light-sensitive compositions according to the second aspect of the present invention is a film-formable polymer having at least one carboxyl group in the molecule. Examples of the polymer of the (A') are a homopolymer of a carboxyl group-containing polymerizable unsaturated monomer; a copolymer of said carboxyl group-containing monomer and other copolymerizable monomer; and a resin of polyester type, polyurethane type, polyamide type or other type having carboxyl group(s) in the molecular chain or at the molecular end(s).

The above-mentioned carboxyl group-containing polymerizable unsaturated monomers include, for example, acrylic acid, methacrylic acid, crotonic acid, itaconic acid etc. The other monomers copolymerizable with these carboxyl group-containing monomers include, for example, $C_1$–$C_{12}$ alkyl esters of (meth)acrylic acid, such as methyl (meth)acrylate, ethyl (meth)acrylate, propyl (meth)acrylate, butyl (meth)acrylate, hexyl (meth)acrylate, octyl (meth) acrylate, 2-ethylhexyl (meth)acrylate, nonyl (meth)acrylate, decyl (meth)acrylate and the like; $C_2$–$C_6$ hydroxyalkyl esters of (meth)acrylic acid, such as hydroxyethyl (meth) acrylate, 2-hydroxypropyl (meth)acrylate, 3-hydroxypropyl (meth)acrylate, hydroxybutyl (meth)acrylate and the like; aromatic vinyl compounds such as styrene, α-methylstyrene, p-tertbutylstyrene and the like; vinyl acetate, (meth)acrylonitrile, (meth)acrylamide, vinylpyrrolidone etc. These monomers can be used individually or in combination of two or more. Among said other monomers, preferable are aromatic vinyl compounds such as styrene, α-methylstyrene, $C_1$–$C_6$ alkyl-substituted styrene (for example, p-tert-butylstyrene) and the like, in view of the precision of formed image patterns, etching resistance, etc.

The carboxyl group-containing polymer (A') preferably has a number-average molecular weight in a range of generally about 3,000 to about 100,000, particularly about 4,000 to about 65,000 and more particularly about 5,000 to 30,000. The desirable carboxyl group content is in a range of generally 0.5 to 10 equivalents, particularly 0.5 to 8 equivalents, and more particularly 0.5 to 5 equivalents per kg of the polymer. When the carboxyl group content is less than 0.5 equivalents/kg, the film formed by heating before irradiation with a visible light has no sufficient crosslinking degree, and the developability tends to decrease due to low solubility of the exposed portions in alkaline developer. On the other hand, when the carboxyl group content is more than 10 equivalents/kg, the storing stability of the composition tends to decrease.

Further, the polymer (A') preferably has a glass transition temperature (Tg) of not lower than 0° C., particularly in a range of 5 to 70° C. When Tg is lower than 0° C., the resulting coating film is sticky and easily picks up dirt and dust, there being the possibility that the handling becomes difficult.

(A") Polymer Having Hydroxyphenyl Group(s)

The polymer (A") used in combination with above-mentioned polymer (A') used in the visible light-sensitive compositions according to the second aspect of the present invention is a polymer having at least one hydroxyphenyl group in the molecule. Examples of the polymer (A") are a condensation product of a monofunctional or polyfunctional phenol compound, an alkylphenol compound or their mixture, and a carbonyl compound such as formaldehyde, acetone or the like; a homopolymer of a hydroxy group-containing aromatic vinyl compound such as p-hydroxystyrene or the like; and a copolymer of said hydroxyl group-containing aromatic vinyl compound and other copolymerizable monomer.

The above-mentioned monofunctional or polyfunctional phenol compounds include, for example, compounds each having 1–3 hydroxyl groups on the benzene ring, such as phenol, o-cresol, m-cresol, p-cresol, 3,5-xylenol, 2,6-xylenol, 2,4-xylenol, catechol, resorcinol, pyrogallol, bisphenol A and the like. The alkylphenol compounds include, for example, alkylphenol compounds whose alkyl moieties each has 1–10 carbon atoms, preferably 1–4 carbon atoms, such as p-isopropyl-phenol, p-tert-butylphenol, p-tert-amylphenol, p-tert-octylphenol and the like.

The condensation reaction between these compounds and the carbonyl compound such as formaldehyde, acetone or the like can be conducted by a per se known method. In general, condensation in the presence of an alkali catalyst gives an insoluble and infusible resole type resin with the progress of condensation; and condensation using an acid catalyst gives a soluble and fusible novolac type resin. In the present invention, the latter novolac type phenolic resin may usually be used. While novolac type phenolic resins increase the molecular weight with the progress of condensation, a novolac type phenolic resin having a molecular weight in a range of 500 to 2,000, particularly 700 to 1,500, is obtained generally by conducting condensation for 1–3 hours.

As other monomer copolymerizable with the hydroxy group-containing aromatic vinyl compound, there can be used the same other copolymerizable monomers as mentioned with respect to the copolymer used in the above-mentioned polymers (A) and (A').

This hydroxyphenyl group-containing polymer (A") preferably has a number-average molecular weight in a range of generally about 500 to about 100,000, particularly about 750 to about 65,000, and more particularly about 1,000 to about 30,000.

The preferable hydroxyphenyl group content in the polymer (A") is in a range of generally 1.0 to 10 equivalents, particularly 2 to 8 equivalents, and more particularly 3 to 6 equivalents, per kg of the polymer (A"). When the hydroxyphenyl group content is less than 1.0 equivalent/kg, the film formed by heating before irradiation with a visible light tends to have insufficient crosslinking degree and, when the content is more than 10 equivalents/kg, the resist film tends to be fragile.

The polymer (A"), similarly to the polymers (A) and (A'), preferably has a glass transition temperature (Tg) of not lower than 0° C., particularly in a range of 5 to 70° C. When Tg is lower than 0° C., the resulting coating film is sticky and easily picks up dirt and dust, there being the possibility that the handling becomes difficult.

(B) Compound Having at Least Two Vinyl Ether Groups in the Molecule

The compound (B) is a low-molecular weight or high-molecular weight compound having, in the molecule, at least two, preferably two to four vinyl ether groups each represented by a formula —R'—O—CH=CH$_2$ [wherein R' represents a C$_1$–C$_6$ straight chain or branched chain alkylene group, such as ethylene, propylene, butylene or the like]. Examples of the compound (B) are condensation products between a polyphenol compound such as bisphenol A, bisphenol F, bisphenol S, phenolic resin etc. or a polyol such as ethylene glycol, propylene glycol, trimethylolpropane, trimethylolethane, pentaerythritol etc. and a halogenated alkyl vinyl ether such as chloroethyl vinyl ether; reaction products between a polyisocyanate such as tolylene diisocyanate, xylylene diisocyanate, hexamethylene diisocyanate, isophorone diisocyanate etc. and a hydroxyalkyl vinyl ether such as hydroxyethyl vinyl ether. Among these, condensation products between a polyphenol compound and a halogenated alkyl vinyl ether, and reaction products between a polyisocyanate compound having an aromatic ring and a hydroxyalkyl vinyl ether are particularly preferable in view of etching resistance, precision of the formed pattern etc.

Preferably, the compound (B) is a liquid at normal temperature, or has a melting or softening point of lower than 150° C., particularly lower than 130° C. The reason is that such a compound (B) can easily migrate into the polymer (A) or the polymers (A') and/or (A") at the heating step before irradiation with a visible light and the carboxyl group(s) and/or the phenolic hydroxyl group(s) in the polymer (A) or the polymers (A') and/or (A") can easily give rise to an addition reaction with the vinyl ether groups in the compound (B).

(C) Compound Which Generates an Acid When Irradiated With a Visible Light

The compound (C) is a compound which, when irradiated with a visible light to be described later, is decomposed and generates an acid having an intensity sufficient to sever the crosslinked structure formed between the above-mentioned polymer (A) or polymers (A') and/or (A") and the compound (B). [Hereinafter, the compound (C) is referred to as "photochemically-acid-generating compound" in some cases.] The compound (C) includes, for example, the compounds represented by the following general formula (I).

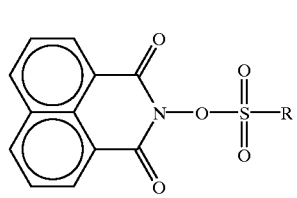

(I)

wherein R represents

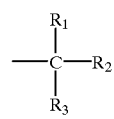

group (where R$_1$, R$_2$ and R$_3$ each independently represents hydrogen atom or fluorine atom),

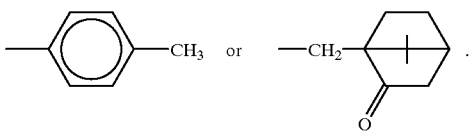

Specific examples of the compounds represented by the above-mentioned formula (I) include, for example,

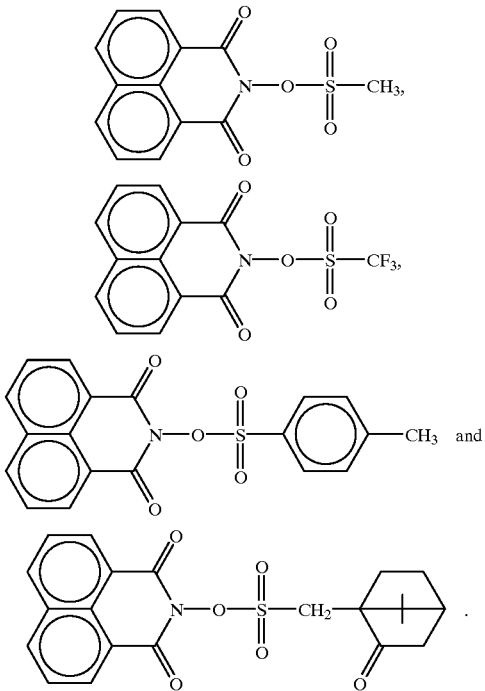

The sensitizing dye (D) used in the visible light-sensitive compositions of the present invention is a compound which is excited by absorbing the light of the wave length range of 400 to 700 nm (visible light) and has a mutual action with the above-mentioned polymers (A), (A'), (A"), the compound (B) and the photochemically-acid-generating compound (C). Examples of the sensitizing dye (D) include the compounds represented by the following general formulae (II) and (III), cyanine type dyes, merocyanine type dyes, coumalin type dyes and the like. Among these, particularly the compounds represented by the general formulae (II) and (III) are preferable. The "mutual action" mentioned here includes energy transfer and electron transfer from the excited sensitizing dye to the other components.

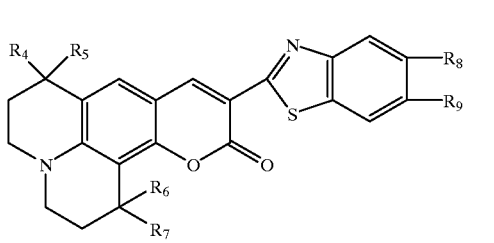

wherein $R_4$, $R_5$, $R_6$ and $R_7$ each independently represents methyl, ethyl, propyl or isopropyl groups, and is preferably a methyl group, and $R_8$ and $R_9$ each independently represents a hydrogen atom, an alkyl group of 1–4 carbon atoms, an alkoxy group of 1–4 carbon atoms, an alkoxycarbonyl group of 2–5 carbon atoms, a dialkylamino group of 1–4 carbon atoms in each alkyl moiety, Cl, Br, CN, $NO_2$ or $SO_2CH_3$, and is preferably a hydrogen atom or a methyl group.

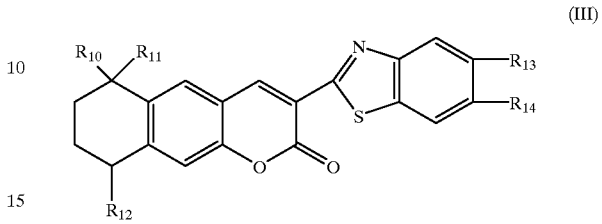

wherein $R_{10}$, $R_{11}$ and $R_{12}$ each independently represents methyl, ethyl, propyl or isopropyl groups, preferably $R_{10}$ and $R_{11}$ are a methyl group and $R_{12}$ is a ethyl group, and $R_{13}$ and $R_{14}$ each independently represents a hydrogen atom, an alkyl group of 1–4 carbon atoms, an alkoxy group of 1–4 carbon atoms, an alkoxycarbonyl group of 2–5 carbon atoms, a dialkylamino group of 1–4 carbon atoms in each alkyl moiety, Cl, Br, CN, $NO_2$ or $SO_2CH_3$, and are preferably a hydrogen or a methyl group.

Besides the compounds represented by above-mentioned (II) and (III), as cyanine type dyes, merocyanine type dyes and coumalin type dyes per se known ones can be used. For example, as cyanine type dyes and merocyanine type dyes, what is described in Japanese Laid-open Publication No. 213838/1986, and as coumalin type dyes what is described in Japanese Laid-open Publications No. 97650/1986 and No. 223759/1991 can be mentioned.

Visible light-sensitive composition

The visible light-sensitive composition according to the first aspect of the present invention comprises, as essential components, four components, i.e., the above-mentioned polymer having carboxyl group(s) and optionally having hydroxyphenyl group(s) (A), compound having vinyl ether groups (B), photochemically-acid-generating compound (C) and sensitizing dye (D). The compounding ratio of the four components can be varied over a wide range depending upon the applications of said composition etc. However, the compound having vinyl ether groups (B) is preferably used in a range of generally 5–150 parts by weight, particularly 10–100 parts by weight, and more particularly 20–80 parts by weight, per 100 parts by weight of the polymer (A). The photochemically-acid-generating compound (C) is appropriately used in a range of generally 0.1–40 parts by weight, particularly 0.2–20 parts by weight, and more particularly 0.5–15 parts by weight, per 100 parts by weight of the total of the polymer (A) and the compound having vinyl ether groups (B). Furthermore, the sensitizing dye (D) can be used in a range of generally 0.1–10 parts by weight, preferably 0.5–5 parts by weight, and more preferably 0.5–3 parts by weight, per 100 parts by weight of the total of the polymer (A) and the compound having vinyl ether groups (B).

The visible light-sensitive composition according to the second aspect of the present invention comprises, as essential components, five components, i.e., the above-mentioned carboxyl group-containing polymer (A'), hydroxyphenyl group-containing polymer (A"), compound having vinyl ether groups (B), photochemically-acid-generating compound (C) and sensitizing dye (D). The compounding ratio of the five components can be varied over a wide range depending upon the applications of said composition etc.

However, the carboxyl group-containing polymer (A') and hydroxyphenyl group-containing polymer (A") may be used in a range of proportions by weight, (A')/(A"), of generally 90/10 to 10/90, particularly 70/30 to 30/70, and more particularly 60/40 to 40/60. The compound having vinyl ether groups (B) is preferably used in a range of generally 5–150 parts by weight, particularly 10–100 parts by weight, and more particularly 10–80 parts by weight, per 100 parts by weight of the total of the carboxyl group-containing polymer (A'), and hydroxyphenyl group-containing polymer (A"). The photochemically-acid-generating compound (C) is appropriately used in a range of generally 0.1–40 parts by weight, particularly 0.2–20 parts by weight, and more particularly 0.5–15 parts by weight, per 100 parts by weight of the total of the carboxyl group-containing polymer (A'), hydroxyphenyl group-containing polymer (A"), and the compound having vinyl ether groups (B). Furthermore, the sensitizing dye (D) can be used in a range of generally 0.1–10 parts by weight, preferably 0.5–5 parts by weight, and more preferably 0.5–3 parts by weight, per 100 parts by weight of the total of the carboxyl group-containing polymer (A'), hydroxyphenyl group-containing polymer (A"), and the compound having vinyl ether groups (B).

In the compositions of the present invention, existence of water is preferable in order to smoothly progress the acid hydrolysis reaction, which takes place in the exposed portions by the acid generated when the resulting film is exposed to light. Therefore, the compositions of the present invention may further contains a hydrophilic resin such as polyethylene glycol, polypropylene glycol, methyl cellulose, ethyl cellulose etc., so that necessary amount of water for the above-mentioned reaction be taken into the resulting film.

The amount of such hydrophilic resin to be added can be usually in a range of generally less than 20 parts by weight, preferably 0.1–10 parts by weight, and more preferably 0.1–5 parts by weight, per 100 parts by weight of the total of the components (A), (B), (C) and (D), or per 100 parts by weight of the total of the components (A'), (A"), (B), (C) and (D).

The compositions of the present invention may also comprise a plasticizer such as phthalic acid ester etc., a polyester resin, an acrylic resin etc. in order to allow the film formed by using the compositions of the present invention to have appropriate flexibility, non-tackiness, etc. The preferable amounts of these additives are usually less than 50 parts by weight, more preferably 0.1 to 30 parts by weight, per 100 parts by weight of the total of the components (A), (B), (C) and (D), or per 100 parts by weight of the total of the components (A'), (A"), (B), (C) and (D).

The compositions of the present invention may furthermore comprise a fluidity-controlling agent, a colorant such as dye or pigment, etc. as necessary.

The photosensitive composition of the present invention can be prepared by mixing the above-mentioned components alone or in a solvent, as necessary. The usable solvent is not particularly restricted as long as it can dissolve the components of the composition, and can include ketones such as acetone, methyl ethyl ketone, methyl isobutyl ketone, cyclohexanone, isophorone and the like; esters such as methyl acetate, ethyl acetate, butyl acetate and the like; aliphatic alcohols of 1–10 carbon numbers such as methanol, ethanol, propanol and the like; aromatic group-containing alcohols such as benzyl alcohol and the like; glycols such as ethylene glycol, propyleneglycol and the like; glycol ethers such as mono- or diethers of these glycols and methanol, ethanol, butanol, hexanol, octanol, benzyl alcohol, phenol etc., or esters of said monoethers; cyclic ethers such as dioxane, tetrahydrofuran and the like; cyclic carbonates such as ethylene carbonate, propylene carbonate and the like; and aliphatic and aromatic hydrocarbons etc. These solvents can be used individually or in admixture of two or more, as necessary.

Formation of Pattern

Pattern formation using the visible light-sensitive composition of the present invention can be conducted as described below.

First, the composition of the present invention is coated on a substrate, such as an aluminium plate for PS plate, a copper-laminated substrate for printed circuit, silicon wafer of semiconductor material etc. by a per se known coating method such as spin coating, spray coating, roll coating, curtain flow coating, coating, printing etc. The thickness of the coating film at that time is not strictly restricted and can be varied depending on the intended application of the formed pattern. However, the appropriate film thickness is usually in a range of about 0.5 to about 15 $\mu$m in terms of dry-film thickness.

The substrate coated with said composition is heated to crosslink and harden the coating film under the conditions of temperature and time, under which a crosslinking reaction substantially occurs between the polymer (A) or polymers (A') and/or (A"), and vinyl ether group-containing compound (B), for example, at about 60° C. to about 150° C., preferably at about 80° C. to about 140° C., for about 1 to about 30 minutes.

Then, the cured coating film on the substrate is irradiated image-selectively with a visible light, using a positive type photomask, a reduction projection aligner, a direct drawing machine or the like. The visible light usable here is selected depending upon the kind of the photochemically-acid-generating compound (C) and the sensitizing dye (D) etc. blended in the photosensitive composition and can include, for example, monochromic rays in the visible area of the wave length 400 to 600 $\mu$m or mixed rays thereof, or Ar laser with an emission of radiation in a visible region.

The substrate irradiated with a visible light is then heated under the conditions of temperature and time, under which the crosslinked structure of the above-mentioned cured coating film is severed in the presence of the acid generated by said irradiation, for example, at about 60 to about 150° C., preferably at about 80 to about 140° C., for about 1 to about 30 minutes, whereby the crosslinked structure of the irradiated portions of the coating film is substantially severed. Preferably in that case, the substrate irradiated with a visible light is previously contacted with water. By contacting with water the acid generates easily and the next severing reaction of the crosslinked structure becomes easier. Contact with water can be conducted by dipping the substrate in water of normal temperature or in warm water, or by blowing water vapor on the substrate. The thus treated substrate after heating-irradiation-contact with water as necessary-heating is treated with a developer, whereby a pattern can be formed on the substrate. As the developer, there can be used a liquid capable of dissolving the polymer (A) or the polymers (A') and (A"), for example, an aqueous basic solution of a water-soluble organic base, i.e., alkanolamine, hydroxyammonium salts such as tetraethylammonium hydroxide etc. or an inorganic alkali, i.e., sodium hydroxide, sodium carbonate, sodium metasilicate etc.

These basic substances can be used individually or as a mixture of two or more. The preferable concentration of these substances is ordinarily in a range of 0.05 to 10% by weight, particularly 1 to 8% by weight. Moreover, as necessary, solvents described as usable solvents in case of producing the visible light-sensitive composition of the present invention may be added at the concentration within a mixable range with said developer.

The development can be conducted by a per se known method, for example, by dipping the substrate in the developer, or by spraying the developer onto the substrate. The substrate, on which a pattern has been formed, can be as necessary water-washed and/or heated for drying.

When the substrate is an etchable type, the exposed portions of the substrate may be removed with an appropriate etchant and, as necessary, the remaining coating film may be removed with an appropriate releasant to obtain a relief image.

The pattern thus formed is very fine and has excellent contrast, and accordingly can be advantageously used in the production of printing plate requiring a fine image, relief, display, printed circuit board etc.

Especially, as the visible light-sensitive composition of the present invention has an excellent thermal stability in case of heating for crosslinking, it is possible to crosslink by a short heating at a high temperature of over 100° C. And as non-exposed portions of the resist film have a crosslinked structure, the non-exposed portions are more resistant against developer and etchant compared with a conventional positive type photoresist. Therefore, the formed pattern has an excellent precision and accordingly a wide range of applications are expected in the field of semiconductor fine processing such as printed circuit board of fine pattern, LSI etc., metal fine processing etc.

The present invention is hereinafter described more specifically by way of Examples. In the Examples, "part(s)" and "%" are by weight.

SYNTHESIS EXAMPLE 1
Synthesis of Polymer A-1 Having Carboxyl Groups and Hydroxyphenyl Groups Into a flask were placed 600 parts of o-hydroxybenzoic acid, 900 parts of o-cresol, 1,145 parts of 30% formalin, 130 parts of deionized water and 6.5 parts of oxalic acid. The mixture was refluxed by heating for 60 minutes. Thereto was added 13.5 parts of 15% hydrochloric acid and the mixture was refluxed by heating for 40 minutes. Then, thereto was added 400 parts of deionized water of about 15° C. The contents in the flask were kept at about 50° C. to precipitate a resin. Thereto was added 400 parts of deionized water to wash the resin at 50° C. The aqueous layer was removed. The washing operation was repeated three times. The resulting resin was dried at about 120° C. under reduced pressure to obtain a novolac phenol resin (polymer A-1). Molecular weight=about 650; carboxyl group content=2.8 moles/kg of polymer; hydroxyphenyl group content=5.4 moles/kg of polymer.

SYNTHESIS EXAMPLE 2
Synthesis of Polymer A-2 Having Carboxyl Groups and Hydroxyphenyl Groups Into a flask were placed 200 parts of tetrahydrofuran, 65 parts of p-hydroxystyrene, 28 parts of n-butyl acrylate, 11 parts of acrylic acid and 3 parts of azobisisobutyronitrile. The gas inside the flask was replaced by nitrogen, after which the flask contents were heated at 100° C. for 2 hours with stirring. The reaction mixture was poured into 1,500 ml of toluene. The resulting precipitate was separated and dissolved in 300 ml of acetone. The solution was poured into 1,500 ml of toluene again. The resulting precipitate was dried at 60° C. under reduced pressure to obtain a polymer A-2. Molecular weight=about 5,200; acrylic acid/n-butyl acrylate/p-hydroxystyrene=17/37/50 (weight ratio); carboxyl group content=1.8 moles/kg of polymer; hydroxyphenyl group content=4.6 moles/kg of polymer.

SYNTHESIS EXAMPLE 3
Synthesis of Polymer A-3 Having Carboxyl Groups and Hydroxyphenyl Groups Into a flask were placed 200 parts of tetrahydrofuran, 93.5 parts of p-hydroxystyrene, 6.5 parts of acrylic acid and 3 parts of azobisisobutyronitrile. The gas inside the flask was replaced by nitrogen and the flask contents were heated at 100° C. for 2 hours with stirring. The reaction mixture was poured into 1,500 ml of toluene. The resulting precipitate was separated and dissolved in 300 ml of acetone. The solution was poured into 1,500 ml of toluene again. The resulting precipitate was dried at 60° C. under reduced pressure to obtain a polymer A-3. Molecular weight=about 2,300; carboxyl group content=1.0 moles/kg of polymer; hydroxyphenyl group content=7.0 moles/kg of polymer.

SYNTHESIS EXAMPLE 4
Synthesis of Polymer A-4 Having Carboxyl Groups

| A mixture consisting of: | |
| --- | --- |
| acrylic acid | 216 parts |
| styrene | 500 parts |
| n-butyl methacrylate | 284 parts |
| azobisisobutyronitrile (AIBN) | 50 parts | was dropwise added, in 2 hours, to 600 parts of methyl isobutyl ketone being stirred at 80° C. The mixture was kept at that temperature for 2 hours to obtain a polymer A-4. Solid content=about 62.5%; carboxyl group content=3 moles/kg of polymer; aromatic ring content=34.6 parts by weight/100 parts by weight of polymer.

SYNTHESIS EXAMPLE 5
Synthesis of Polymer A-5 Having Carboxyl Groups

| A mixture consisting of: | |
| --- | --- |
| acrylic acid | 288 parts |
| styrene | 300 parts |
| n-butyl acrylate | 255 parts |
| 2-hydroxyethyl acrylate | 157 parts |
| tert-butyl peroxybenzoate | 100 parts | was dropwise added, in 2 hours, to 1,000 parts of 2-butoxyethanol being stirred at 110° C. The mixture was kept at that temperature for 2 hours to obtain a polymer A-5. Solid content=about 50%; carboxyl group content=4 moles/kg of polymer; aromatic ring content=20.7 parts by weight/100 parts by weight of polymer.

SYNTHESIS EXAMPLE 6
Synthesis of Polymer A-6 Having Carboxyl Groups

| A mixture consisting of: | |
| --- | --- |
| acrylic acid | 72 parts |
| styrene | 650 parts |

-continued

| ethyl acrylate | 100 parts |
| n-butyl acrylate | 178 parts |
| AIBN | 75 parts | was polymerized in the same manner as in Synthesis Example 4 to obtain a polymer A-6. Solid content=about 62.5%; carboxyl group content=1 mole/kg of polymer; aromatic ring content=45 parts by weight/100 parts by weight of polymer.

SYNTHESIS EXAMPLE 7
Synthesis of Polymer A-7 Having Hydroxyphenyl Groups

Into a flask were placed 1,490 parts of o-cresol, 1,145 parts of 30% formalin, 130 parts of deionized water and 6.5 parts of oxalic acid. The mixture was refluxed by heating for 60 minutes. Thereto was added 13.5 parts of 15% hydrochloric acid. The mixture was refluxed by heating for 40 minutes. Thereto was added 400 parts of deionized water of about 15° C. The contents in the flask were kept at about 75° C. to precipitate a resin. Thereto was added a 35% aqueous sodium hydroxide solution for neutralization. Then the aqueous layer was removed. To the resin layer was added 400 parts of deionized water to wash the resin at 75° C. The aqueous layer was removed. The washing operation was repeated twice. The resin was dried at about 120° C. under reduced pressure to obtain a novolac phenol resin (polymer A-7). Molecular weight=about 600.

SYNTHESIS EXAMPLE 8
Synthesis of Polymer A-8 Having Hydroxyphenyl Groups

Into a flask were placed 60 parts of tetrahydrofuran, 21 parts of p-hydroxystyrene, 9 parts of n-butyl acrylate and 3 parts of azobisisobutyronitrile. The gas inside the flask was replaced by nitrogen, and the flask contents were heated at 100° C. for 2 hours with stirring. The reaction mixture was poured into 700 ml of toluene. The resulting precipitate was separated and dissolved in 100 ml of acetone. The solution was poured into 700 ml of toluene again. The resulting precipitate was dried at 60° C. under reduced pressure to obtain a polymer A-8. Molecular weight=about 14,000; n-butyl acrylate/p-hydroxystyrene=35/65 (weight ratio).

SYNTHESIS EXAMPLE 9
Synthesis of Vinyl Ether Compound B-1

Into a 250-ml flask were placed 45.6 g of bisphenol A, 80 ml of 2-chloroethyl vinyl ether and 100 ml of toluene. The gas inside the flask was replaced by nitrogen. 20 g of sodium hydroxide was added. The mixture was heated at 80° C. for 30 minutes. Then, there was added a solution of 4.56 g of tetrabutylammonium bromide dissolved in 20 ml of 2-chloroethyl vinyl ether. The mixture was heated at 95° C. for 5 hours for a reaction. The reaction mixture was washed with deionized water three times. The organic layer was separated and subjected to distillation to remove unreacted 2-chloroethyl vinyl ether and toluene to obtain a vinyl ether compound B-1. This compound had two vinyl ether groups in the molecule.

SYNTHESIS EXAMPLE 10
Synthesis of Vinyl Ether Compound B-2

Into a flask were placed 1,490 parts of o-cresol, 1,145 parts of 30% formalin, 130 parts of deionized water and 6.5 parts of oxalic acid. The mixture was refluxed by heating for 60 minutes. Thereto was added 13.5 parts of 15% hydrochloric acid. The mixture was refluxed by heating for 40 minutes. Thereto was added 400 parts of deionized water of about 15° C. The contents in the flask were kept at about 75° C. to precipitate a resin. Thereto was added a 35% aqueous sodium hydroxide solution for neutralization. Then the aqueous layer was removed. To the resin layer was added 400 parts of deionized water to wash the resin at 75° C. The aqueous layer was removed. The washing operation was repeated twice. The resin was dried at about 120° C. under reduced pressure to obtain a novolac phenol resin. Molecular weight=about 600.

The operation of Synthesis Example 9 was repeated except that 45.6 g of bisphenol A was replaced by 15 g of said resin, to obtain a vinyl ether compound B-2. This compound had about three and half vinyl ether groups in the molecule.

SYNTHESIS EXAMPLE 11
Synthesis of Vinyl Ether Compound B-3

875 parts of a 75% ethylene glycol dimethyl ether solution of a polyisocyanate obtained by reacting 1 mole of trimethylolpropane with 3 moles of tolylene diisocyanate was reacted with 264 parts of 2-hydroxyethyl vinyl ether in the presence of 1 part of dibutyl-tin diacetate at 35° C. for 3 hours to obtain a vinyl ether compound B-3. This compound had three vinyl groups in the molecule. Solid content=about 81%.

EXAMPLE 1

| A mixture consisting of | |
| --- | --- |
| Copolymer A-4 (solid content: 62.5%) | 160 parts |
| Vinyl ether compound B-1 | 70 parts |
| Polyethylene glycol (average molecular weight: 400) | 2 parts |
| Photochemically-acid-generating compound C-1 (*1) | 10 parts |
| Sensitizing dye-1 (*2) | 1 part | was dissolved in diethylene glycol dimethyl ether to make 20% by weight solution.

After being coated by a spin coater on a silicon wafer to make a film with 1 μm thickness in terms of dry film thickness, it was dried at 120° C. for 8 minutes.

The thus obtained substrate was irradiated with a visible light of 488 nm wave length with the exposure being changed gradiently, and then was heated at 120° C. for 10 minutes. The substrate after irradiation and heating was subjected to development with an aqueous solution containing 2.38% of tetramethylammonium hydroxide.

A curve of yield of residual film after development to exposure of visible light was prepared. From the curve was determined a γ value (*3). The γ value was 10.5, which indicated very high contrast. There was neither decrease nor swelling of the unirradiated film portions.

A film with 1 μm thickness was formed on a silicon wafer in the same manner, irradiated with a visible light of 488 nm wave length at an exposure of 8 mJ/cm$^2$ through a pattern mask, and dipped in water of normal temperature for a minute. The thus treated film was subjected to the same treatment as above, to form an image pattern of line/space= 1/1 μm. The sectional shape of the image pattern was evaluated by the angle formed by the wafer surface and the wall surface of image pattern. The angle was 88°, which indicated a very excellent pattern shape. The lowest exposure for image formation was 6 mJ/cm$^2$.

(*1) Photochemically-acid-generating compound C-1:
  NAI-100 made by Midori Chemical, represented by the following formula, was used.

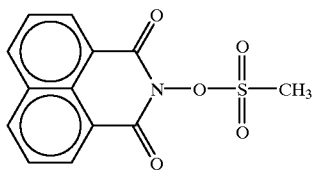

(*2) Sensitizing dye-1: NKX-1595 made by Nippon Kanko Shikiso Kenkyusho, represented by the following formula, was used.

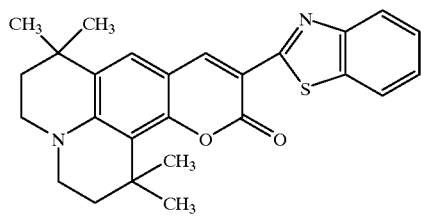

(*3) γ value: An index showing a contrast level. A higher γ value shows higher contrast. The measurement of γ value was conducted by the method described in "Photopolymer Handbook" pp. 101–103 (1989), edited by Photopolymer Conference and published by Kogyo Chosakai (Tokyo).

EXAMPLE 2

| A mixture consisting of | |
|---|---|
| Copolymer A-5 (solid content: 50%) | 200 parts |
| Vinyl ether compound B-2 | 20 parts |
| Polyethylene glycol (average molecular weight: 400) | 2 parts |
| Photochemically-acid-generating compound C-2 (*4) | 7.5 parts |
| Sensitizing dye-2 (*5) | 1 part | was dissolved in the same manner as Example 1, coated by a spin coater on a silicon wafer to make a film with 3 μm thickness in terms of dry film thickness, it was dried at 120° C. for 5 minutes.

The γ value of the thus obtained substrate was determined exactly in the same manner as Example 1. The γ value was 10.0, which indicated very high contrast. There was neither decrease nor swelling of the unirradiated film portions.

Then the sectional shape of the image pattern was evaluated using a visible light of 488 nm wave length as the light for irradiation and exactly in the same manner as Example 1, except at an exposure of 3 mJ/cm². The angle was 88°, which indicated a very excellent pattern shape. The lowest exposure for image formation was 2 mJ/cm².

(*4) Photochemically-acid-generating compound C-2: NAI-105 made by Midori Chemical, represented by the following formula, was used.

(*5) Sensitizing dye-2: The compound made by Nippon Kanko Shikiso Kenkyusho, represented by the following formula, was used.

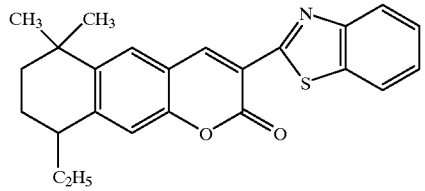

EXAMPLE 3

| A mixture consisting of | |
|---|---|
| Copolymer A-6 (solid content: 62.5%) | 160 parts |
| Vinyl ether compound B-3 | 15 parts |
| Photochemically-acid-generating compound C-3 (*6) | 5 parts |
| Sensitizing dye-2 (*7) | 1 part | was dissolved in the same manner as Example 1, coated by a roll coater on a substrate, made of a polyimide film on which a copper foil of 18 μm thickness was laminated, to make a film with 5 μm thickness in terms of dry film thickness, it was dried at 120° C. for 8 minutes.

The γ value of the thus obtained substrate was determined exactly in the same manner as Example 1. The γ value was very high as 9.5.

Then on the resist film on the substrate prepared in the same manner, a pattern of line/space=30/30 μm was drawn by a direct-drawing machine using argon ion laser of 488 nm wave length at an energy density of 2 mJ/cm². Then after heating at 100° C. for 10 minutes, it was developed with 3% aqueous solution of sodium carbonate. By etching the exposed copper with copper chloride and then by eliminating the film on the substrate with 3% aqueous solution of sodium hydroxide, an excellent etching pattern was formed on the substrate.

(*6) Photochemically-acid-generating compound C-3: NAI-101 made by Midori Chemical, represented by the following formula, was used.

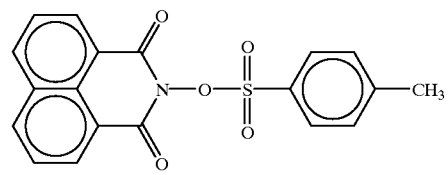

(*7) Sensitizing dye-3: LS-5 made by Mitsui-Toatsu Chemicals, represented by the following formula, as used.

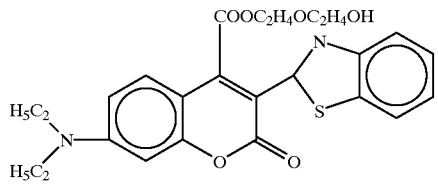

EXAMPLE 4

| A mixture consisting of | |
|---|---|
| Polymer A-1 | 100 parts |
| Vinyl ether compound B-1 | 60 parts |
| Polyethylene glycol (average molecular weight: 400) | 2 parts |
| Photochemically-acid-generating compound C-1 (*1) | 10 parts |
| Sensitizing dye-1 (*2) | 0.5 parts | was dissolved in diethylene glycol dimethyl ether to make 20% by weight solution.

After being coated by a spin coater on a silicon wafer to make a film with 1 μm thickness in terms of dry film thickness, it was dried at 120° C. for 8 minutes.

The γ value of the thus obtained substrate was determined exactly in the same manner as Example 1. The γ value was 11.5, which indicated very high contrast. There was neither decrease nor swelling of the unirradiated film portions.

Then the sectional shape of the image pattern was evaluated in the same manner as Example 1, except at an exposure of visible light of 7 mJ/cm². The angle was 89°, which indicated a very excellent pattern shape. The lowest exposure for image formation was 5 mJ/cm².

EXAMPLE 5

| A mixture consisting of | |
|---|---|
| Polymer A-2 | 100 parts |
| Vinyl ether compound B-2 | 25 parts |
| Polyethylene glycol (average molecular weight: 400) | 2 parts |
| Photochemically-acid-generating compound C-2 (*4) | 7.5 parts |
| Sensitizing dye-4 (*8) | 1 part | was dissolved in the same manner as Example 4 and coated by a spin coater on a silicon wafer to make a film with 3 μm thickness in terms of dry film thickness. It was dried at 120° C. for 5 minutes.

The γ value of the thus obtained substrate was determined exactly in the same manner as Example 1. The γ value was 10.2, which indicated very high contrast. There was neither decrease nor swelling of the unirradiated film portions.

Then the sectional shape of the image pattern was evaluated using a visible light of 488 nm wave length as the light for irradiation and exactly in the same manner as Example 1, except at an exposure of 3 mJ/cm². The angle was 89°, which indicated a very excellent pattern shape. The lowest exposure for image formation was 2 mJ/cm².

(*8) Sensitizing dye-4: The compound made by Nippon Kanko Shikiso Kenkyusho, represented by the following formula, was used.

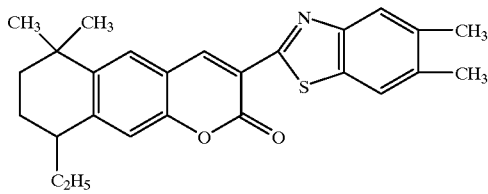

EXAMPLE 6

| A mixture consisting of | |
|---|---|
| Polymer A-3 | 100 parts |
| Vinyl ether compound B-3 (solid content: 81%) | 20 parts |
| Photochemically-acid-generating compound C-3 (*6) | 5 parts |
| Sensitizing dye-3 (*7) | 1 part | was dissolved in the same manner as Example 1, coated by a roll coater on a substrate, made of a polyimide film on which a copper foil of 18 μm thickness was laminated, to make a film with 5 μm thickness in terms of dry film thickness. It was dried at 120° C. for 8 minutes.

The γ value of the thus obtained substrate was determined exactly in the same manner as Example 1. The γ value was very high as 9.8.

Then on the resist film on the substrate prepared in the same manner, a pattern of line/space=30/30 μm was drawn by a direct-drawing machine using argon ion laser of 488 nm wave length at an energy density of 2 mJ/cm². Then after heating at 130° C. for 10 minutes, it was developed with 3% aqueous solution of sodium carbonate. After that, by etching the exposed copper with copper chloride and by eliminating the film on the substrate with 3% aqueous solution of sodium hydroxide, an excellent etching pattern was formed on the substrate.

EXAMPLE 7

| A mixture consisting of | |
|---|---|
| Polymer A-4 (solid content: 62.5%) | 80 parts |
| Polymer A-7 | 65 parts |
| Vinyl ether compound B-1 | 60 parts |
| Polyethylene glycol (average molecular weight: 400) | 2 parts |
| Photochemically-acid-generating compound C-1 (*1) | 10 parts |
| Sensitizing dye-1 (*2) | 1 part | was dissolved in diethylene glycol dimethyl ether to make 20% by weight solution.

After being coated by a spin coater on a silicon wafer to make a film with 1 μm thickness in terms of dry film thickness, it was dried at 120° C. for 8 minutes.

The thus obtained substrate was irradiated with a visible light of 488 nm wave length with the exposure being changed gradiently, and then heated at 130° C. for 10 minutes. The substrate after irradiation and heating was subjected to development with an aqueous solution containing 2.38% of tetramethylammonium hydroxide.

The γ value, determined from the curve of yield of residual film after development to exposure of visible light, was 10.5, which indicated very high contrast. There was neither decrease nor swelling of the unirradiated film portions.

Then the sectional shape of the image pattern was evaluated in the same manner as Example 1, except at an exposure of visible light of 7 mJ/cm². The angle was 88°, which indicated a very excellent pattern shape. The lowest exposure for image formation was 5 mJ/cm².

EXAMPLE 8

| A mixture consisting of | |
|---|---|
| Polymer A-5 (solid content: 50%) | 200 parts |
| Polymer A-8 | 100 parts |
| Vinyl ether compound B-2 | 100 parts |
| Polyethylene glycol (average molecular weight: 400) | 2 parts |
| Photochemically-acid-generating compound C-2 (*4) | 7.5 parts |
| Sensitizing dye-2 (*5) | 1 part | was dissolved in the same manner as Example 1, coated by a spin coater on a silicon wafer to make a film with 3 μm thickness in terms of dry film thickness. It was dried at 120° C. for 5 minutes.

The γ value of the thus obtained substrate was determined exactly in the same manner as Example 1. The γ value was 11.0, which indicated very high contrast. There was neither decrease nor swelling of the unirradiated film portions.

Then the sectional shape of the image pattern on the substrate, which was coated and dried under the above-mentioned conditions, was evaluated using a visible light of 488 nm wave length as the light for irradiation and exactly the same manner as Example 1, except at an exposure of 2 mJ/cm². The angle was 88°, which indicated a very excellent pattern shape. The lowest exposure for image formation was 1.5 mJ/cm².

EXAMPLE 9

| A mixture consisting of | |
|---|---|
| Polymer A-6 (solid content: 62.5%) | 112 parts |
| Polymer A-8 | 30 parts |
| Vinyl ether compound B-3 (solid content: 81%) | 15 parts |
| Photochemically-acid-generating compound C-3 (*6) | 5 parts |
| Sensitizing dye-3 (*7) | 1 part | was dissolved in the same manner as Example 1, coated by a roll coater on a substrate, made of a polyimide film on which a copper foil of 18 μm thickness was laminated, to make a film with 5 μm thickness in terms of dry film thickness. It was dried at 120° C. for 8 minutes.

The γ value of the thus obtained substrate was determined exactly in the same manner as Example 1. The γ value was very high as 9.9.

Then on the resist film on the substrate prepared in the same manner, a pattern of line/space=30/30 μm was drawn by a direct-drawing machine using argon ion laser of 488 nm wave length at an energy density of 2 mJ/cm². Then after heating at 130° C. for 10 minutes, it was developed with 3% aqueous solution of sodium carbonate. After that, by etching the exposed copper with copper chloride and by eliminating the film on the substrate with 3% aqueous solution of sodium hydroxide, an excellent etching pattern was formed on the substrate.

What is claimed is:

1. A visible light-sensitive composition comprising (A) a polymer having carboxyl group(s) and optionally having hydroxyphenyl group(s); (B) a compound having at least two vinyl ether groups per molecule; (C) a compound, which generates an acid when irradiated with a visible light, represented by the general formula (I)

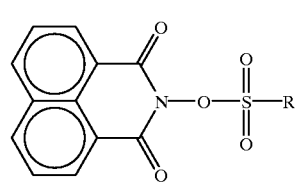

(I)

wherein R represents

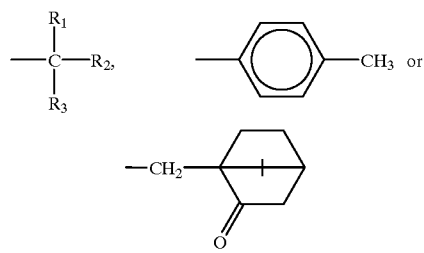

group, wherein $R_1$, $R_2$ and $R_3$ each independently represents a hydrogen atom or a fluorine atom,

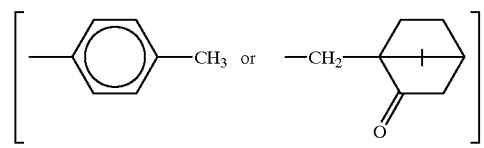

and (D) a sensitizing dye selected from the group consisting of compounds represented by formulae (II) and (III)

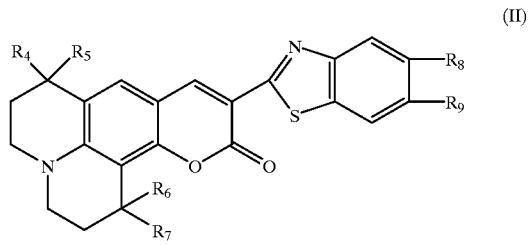

(II)

wherein $R_4$, $R_5$, $R_6$ and $R_7$ each independently represents methyl, ethyl, propyl or isopropyl groups, and $R_8$ and $R_9$ each independently represents a hydrogen atom, an alkyl group of 1–4 carbon atoms, an alkoxy group of 1–4 carbon atoms, an alkoxycarbonyl group of 2–5 carbon atoms, a dialkylamino group having 1–4 carbon atoms in each alkyl moiety, Cl, Br, CN, $NO_2$ or $SO_2CH_3$; and (III)

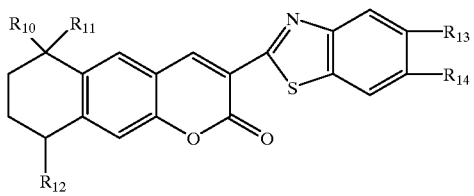

wherein $R_{10}$, $R_{11}$ and $R_{12}$ each independently represents methyl, ethyl, propyl or isopropyl groups, and $R_{13}$ and $R_{14}$ each independently represents a hydrogen atom, an alkyl group of 1–4 carbon atoms, an alkoxy group of 1–4 carbon atoms, an alkoxycarbonyl group of 2–5 carbon atoms, a dialkylamino group having 1–4 carbon atoms in each alkyl moiety, Cl, Br, CN, $NO_2$ or $SO_2CH_3$.

2. The composition set forth in claim 1, wherein the polymer (A) has a number-average molecular weight of about 500 to about 100,000.

3. The composition set forth in claim 1, wherein the polymer (A) has carboxyl group(s) of 0.5–10 equivalents per kg of the polymer.

4. The composition set forth in claim 1, wherein the polymer (A) has hydroxyphenyl group(s) of 1–10 equivalents per kg of the polymer.

5. The composition set forth in claim 1, wherein the polymer (A) has a glass transition temperature (Tg) not lower than 0° C.

6. The composition set forth in claim 1, which contains the vinyl ether group-containing compound (B) in an amount of 5–150 parts by weight per 100 parts per weight of the polymer (A).

7. The composition set forth in claim 1, which contains the acid-generating compound (C) in an amount of 0.1–40 parts by weight per 100 parts by weight of the total of the polymer (A) and the vinyl ether group-containing compound (B).

8. The composition set forth in claim 1, which contains the sensitizing dye (D) in an amount of 0.1–10 parts by weight per 100 parts by weight of the total of the polymer (A) and the vinyl ether group-containing compound (B).

9. A visible light-sensitive composition comprising (A') a polymer having carboxyl group(s); (A") a polymer having hydroxyphenyl group(s); (B) a compound having at least two vinyl ether groups per molecule, (C) a compound, which generates an acid when irradiated with a visible light, represented by the general formula (I)

(I)

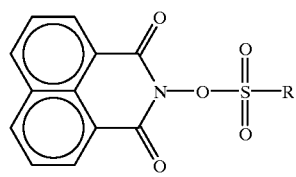

wherein R represents

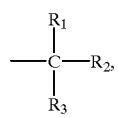 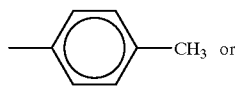

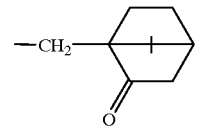

groups wherein $R_1$, $R_2$ and $R_3$ each independently represents a hydrogen atom or a fluorine atom,

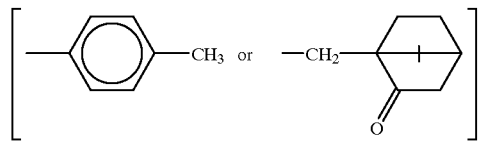

and (D) a sensitizing dye selected from the group consisting of compounds represented by formulae (II) and (III)

(II)

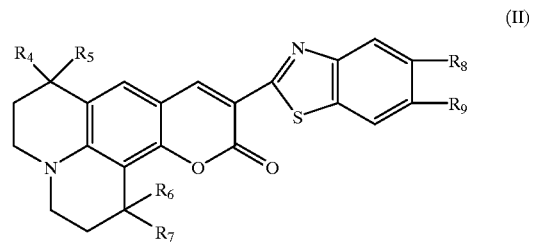

wherein $R_4$, $R_5$, $R_6$ and $R_7$ each independently represents methyl, ethyl, propyl or isopropyl groups, and $R_8$ and $R_9$ each independently represents a hydrogen atom, an alkyl group of 1–4 carbon atoms, an alkoxy group of 1–4 carbon atoms, an alkoxycarbonyl group of 2–5 carbon atoms, a dialkylamino group having 1–4 carbon atoms in each alkyl moiety, Cl, Br, CN, $NO_2$ or $SO_2CH_3$; and (III)

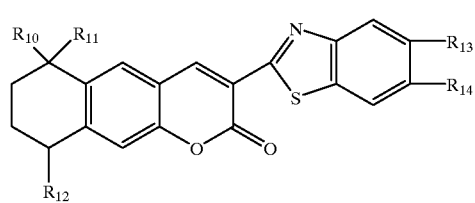

wherein $R_{10}$, $R_{11}$ and $R_{12}$ each independently represents methyl, ethyl, propyl or isopropyl groups, and $R_{13}$ and $R_{14}$ each independently represents a hydrogen atom, an alkyl group of 1–4 carbon atoms, an alkoxy group of 1–4 carbon atoms, an alkoxycarbonyl group of 2–5 carbon atoms, a dialkylamino group having 1–4 carbon atoms in each alkyl moiety, Cl, Br, CN, $NO_2$ or $SO_2CH_3$.

10. The composition set forth in claim 9, wherein the polymer (A') has a number-average molecular weight of about 3,000 to about 100,000.

11. The composition set forth in claim 9, wherein the polymer (A') has carboxyl group(s) of 0.5–10 equivalents per kg of the polymer.

12. The composition set forth in claim 9, wherein the polymer (A") has a number-average molecular weight of about 500 to about 100,000.

13. The composition set forth in claim 9, wherein the polymer (A") has hydroxyphenyl group(s) of 1–10 equivalents per kg of the polymer.

14. The composition set forth in claim 9, wherein each of the polymers (A') and (A") has a glass transition temperature (Tg) not lower than 0° C.

15. The composition set forth in claim 9, wherein the proportion by weight of the polymer (A') to the polymer (A") is 90/10–10/90.

16. The composition set forth in claim 9, which contains the vinyl ether group-containing compound (B) in an amount of 5–150 parts by weight per 100 parts by weight of the total of the polymer (A') and the polymer (A").

17. The composition set forth in claim 9, which contains the acid-generating compound (C) in an amount of 0.1–40 parts by weight per 100 parts by weight of the total of the polymer (A'), the polymer (A") and the vinyl ether group-containing compound (B).

18. The composition set forth in claim 9, which contains the sensitizing dye (D) in an amount of 0.1–10 parts by weight per 100 parts by weight of the total of the polymer (A'), the polymer (A") and the vinyl ether group-containing compound (B).

19. The composition set forth in claim 1 or claim 9, wherein the vinyl ether group-containing compound (B) is a low-molecular weight or high-molecular weight compound having, in the molecule, two to four vinyl ether groups represented by a formula —R'—O—CH=CH$_2$ wherein R' represents a C$_1$–C$_6$ straight chain or branched chain alkylene group.

20. The composition set forth in claim 1 or claim 9, wherein the vinyl ether group-containing compound (B) is a condensation product between a polyphenol compound and a halogenated alkyl vinyl ether, or a reaction product between a polyisocyanate compound having an aromatic ring and a hydroxyalkyl vinyl ether.

21. The composition set forth in claim 1 or claim 9, wherein the acid-generating compound (C) is selected from the group consisting of

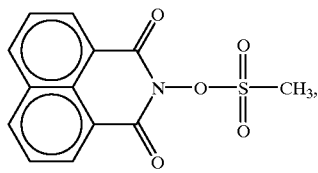

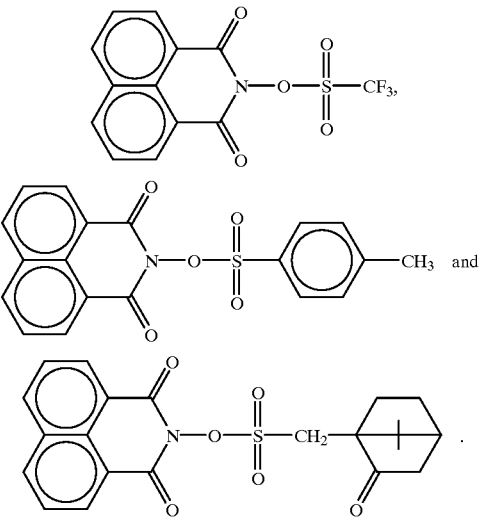

22. The composition set forth in claim 1 or claim 9, which further contains hydrophilic resins.

23. A process for pattern formation comprising conducting sequentially:

coating a visible light-sensitive composition as set forth in claim 1 or claim 9, on a substrate, heating said substrate, irradiating the resulting substrate image-selectively with a visible light, heating the irradiated substrate, and subjecting the resulting substrate to development with a basic developer.

24. A process set forth in claim 23, which further comprising contacting the substrate with water, after the irradiating the substrate image-selectively with a visible light.

25. A pattern which is formed by the process set forth in claim 23.

* * * * *